United States Patent
Fujioka et al.

[11] Patent Number: 5,986,960
[45] Date of Patent: *Nov. 16, 1999

[54] SEMICONDUCTOR INTEGRATED CIRCUIT

[75] Inventors: Shinya Fujioka; Atsushi Hatakeyama, both of Kawasaki, Japan

[73] Assignee: Fujitsu Limited, Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/910,899

[22] Filed: Aug. 13, 1997

[30] Foreign Application Priority Data

Jan. 10, 1997 [JP] Japan ................................. 9-003164

[51] Int. Cl.$^6$ ........................................................ G11C 7/00

[52] U.S. Cl. .......................... 365/226; 365/208; 365/212; 365/229; 365/189.08; 307/125

[58] Field of Search ........................ 365/203, 40, 203.05, 365/189.05, 145, 226, 208, 212, 229, 189.08, 185.11, 84, 227, 207; 307/125

[56] References Cited

U.S. PATENT DOCUMENTS

| | | | |
|---|---|---|---|
| 4,967,397 | 10/1990 | Kajigaya | 365/40 |
| 5,274,601 | 12/1993 | Kawahara et al. | 365/203.06 |
| 5,305,262 | 4/1994 | Yoneda | 365/189.05 |
| 5,673,231 | 9/1997 | Furutani | 365/203 |
| 5,726,930 | 3/1998 | Hasegawa | 365/145 |

*Primary Examiner*—David Nelms
*Assistant Examiner*—Thong Le
*Attorney, Agent, or Firm*—Nikaido Marmelstein Murray & Oram LLP

[57] ABSTRACT

A semiconductor integrated circuit having a DRAM, or the like, includes a memory cell block containing a plurality of memory cells, and a core circuit portion for selecting and activating a specified memory cell inside the memory cell block, and is constituted so that a step-up voltage is applied to the core circuit portion at the time of an activated state. The semiconductor integrated circuit further includes a step-up voltage lowering unit for lowering the step-up voltage by a predetermined value and a unit for selectively supplying the step-up voltage and an output voltage of the step-up voltage lowering unit to the core circuit portion.

27 Claims, 14 Drawing Sheets

SEMICONDUCTOR INTEGRATED CIRCUIT

BACKGROUND OF THE INVENTION

1. Field of the Invention

The present invention relates to a semiconductor integrated circuit comprising a dynamic random access memory (generally referred to as "DRAM") containing semiconductor devices such as a plurality of MOS field effect transistors (hereinafter referred to as "MOS transistors" or "MOS FETs").

In order to achieve a higher DRAM storage capacity, a DRAM having a configuration in which a plurality of one-transistor/one-capacitor type memory cells, each including one nMOS transistor and one capacitor, are formed on a chip has been used in recent years. When nMOS transistors (n-channel MOS type field effect transistors) are used for cell transistors for writing data to the memory cells or for bit line transfer transistors for reading out the data from these memory cells by a shared type sense amplifier, so as to attain a higher integration storage capacity of a semiconductor integrated circuit comprising the DRAM, etc., an influence of a threshold voltage between a gate and a source of each nMOS transistor must be taken into consideration.

To eliminate the influence of the threshold voltage of the nMOS transistors and to carry out stable write and read operations to and from a plurality of memory cells inside the DRAM, a step-up voltage which is higher, by at least the threshold voltage, than a source of each nMOS transistor used as a cell transistor and a bit line transfer transistor (i.e., a step-up voltage which is higher, by at least the threshold voltage, than a high voltage level of each bit line) is generated, and is supplied to the gate voltage of the nMOS transistor.

2. Description of the Related Art

To begin with, constructions of gate voltage generating portions of cell transistors and bit line transfer transistors in conventional DRAMs and their operations will be explained with reference to the accompanying drawings (FIGS. 1 to 3), in order to clarify the problems which may occur when the step-up voltage is generated so as to stably carry out write and read operations to and from a plurality of memory cells in the DRAM constituting a semiconductor integrated circuit.

FIG. 1 is a block diagram showing a construction of a cell transistor in a conventional DRAM; FIG. 2 is a block circuit diagram showing a construction of a bit line transfer transistor in the DRAM described above; and FIG. 3 is a diagram showing an operation voltage waveform at the time of read operation of cell data in the DRAM described above. Here, a gate voltage generating portion of cell transistors inside the memory cell block (i.e., memory cell array) containing a plurality of memory cells, a gate voltage generating portions of bit line transfer transistors, etc., will be referred to as a "core circuit portion" for distinguishing them from peripheral circuits inside the semiconductor integrated circuit. (The term "core circuit portion" designates a circuit portion for selecting and activating specified memory cells inside the memory cell block, and is sometimes referred to as a "memory cell driving/control portion".)

As shown in FIG. 1, each of the one-transistor/one-capacitor type memory cells of the DRAM widely used at present is constituted by a cell transistor Tc including one nMOS transistor and one cell capacitor Cc. When data "1" or "0" is written to this type of memory cell through a bit line BL, the cell transistor Tc must be activated (turned ON) by supplying an output voltage of a high voltage level to the cell transistor Tc from a word decoder unit 9 connected to a word line WL. Further, in order to conduct the data read operation from the memory cell without error by increasing the change of the voltage generated by accumulated charges Qs in the cell capacitor Cc, an input voltage which is sufficiently high to guarantee a stable operation of the cell transistor Tc must be applied to the gate.

In this case, however, the change of the voltage of the accumulated charges Qs becomes smaller than an expected value by the threshold voltage Vth between the gate and the source of the cell transistor as shown in the operation voltage waveform diagram of FIG. 3. To eliminate an influence of this threshold voltage Vth, too, a step-up voltage SVii (see FIG. 1), which is higher, by at least the threshold voltage described above, than the voltage of the source or the voltage of the drain of the nMOS transistor is supplied to the word line WL by using a step-up power source.

On the other hand, when data is read out from either one of two pairs of bit lines BLX(n), BLZ(n) and BLX(n+1), BLZ(n+1) by a shared type sense amplifier 77 (note that the sense amplifier 77 uses a reference power source voltage Vii) as shown in FIG. 2, either one of read transistors Tx(n), Tz(n) and read transistors Tx(n+1), Tz(n+1) corresponding to either one of the two pairs of the bit lines must be activated (turned ON) by either one of the bit line transfer signals BLTX(n) and BLTX(n+1) of the step-up voltage level that are output from bit line transfer signal generating units 70-n and 70-n+1, respectively. Further, to guarantee a stable operation of the sense amplifier 77, each of the bit line transfer signals represented as BLTX must have a voltage level which is sufficiently high.

However, in order to carry out the read operation of data without error by eliminating the influence of the threshold voltage Vth, the bit line transfer signals BLTX having an output level of the step-up voltage, which is higher, by at least the threshold voltage described above, than the voltage of the source or the voltage of the drain of the nMOS transistor, is also supplied to the bit line transfer signal generating units 70 (70-n and 70-n+1) by using a step-up power source generating a step-up voltage SVii (see FIG. 2).

FIG. 4 is a block circuit diagram showing a state in which a step-up voltage is used in a semiconductor integrated circuit according to the prior art, and FIG. 5 is an operation voltage waveform diagram showing the relationship between a step-up voltage and a circuit selecting signal in a semiconductor integrated circuit according to the prior art. The construction of the semiconductor integrated circuit comprising the DRAM according to the prior art, and its operation, will be hereby explained exemplarily. Incidentally, like reference numerals will be hereinafter used to identify like constituent elements used in FIGS. 4 to 7.

In the semiconductor integrated circuit according to the prior art shown in FIG. 4, a step-up voltage generating unit 5 inside a chip generates the step-up voltage (drive voltage) SVii higher, by at least the threshold voltage, than the voltage of the source or the voltage of the drain of the nMOS transistor, and supplies this voltage to a core circuit portion (memory cell block drive/control portion) 3 as the step-up power source of the core circuit portion 3 inclusive of the word decoder unit 9 and the bit line transfer signal generating unit 70.

An explanation will be given on this point in further detail. When the memory cell block inside the semiconductor integrated circuit has a plurality of operation blocks and when the data is written to a specified memory cell inside one memory cell block, the output level of the bit line transfer signal BLTX for selecting the operation block containing this specified memory cell is set to the voltage level of a source voltage Vss (that is, a low voltage level) while the step-up voltage SVii is supplied to the specified memory cell so as to selectively activate this memory cell and to change the output voltage of the cell transistors inside the memory cell, as shown in the operation waveform diagram of FIG. 5.

As described above, in order to eliminate the influence of the threshold voltage of the nMOS transistors and to stably carry out write and read operations to and from a plurality of memory cells inside the DRAM in the conventional semiconductor integrated circuit, the step-up voltage SVii higher by at least the threshold voltage than the voltage of the source or the voltage of the drain of the nMOS transistors is generated and is supplied to the gate voltage of the nMOS transistors of the word decoder unit, the bit line transfer signal generating unit, and so forth.

Next, the problems encountered when the memory cells inside the semiconductor integrated circuit are operated by using the step-up voltage as described above will be explained with reference to the accompanying drawings (FIGS. 6 and 7).

FIG. 6 is a graph showing the relationship between the power source voltage of the MOS transistor and an inter-band tunnel current, and FIG. 7 shows the mode of an increase in a stand-by current in the prior art.

Generally speaking, the word decoder unit and the bit line transfer signal generating unit of the cell array containing the memory cells and the cell drive/control portion are inclined to include a relatively large number of circuits. Further, because the step-up voltage SVii higher than the voltage of the reference power source is used as the power source for circuits constituting the word decoder unit, etc., the step-up voltage described above is always applied to the MOS transistors of an input portion of the word decoder unit, etc., even under the stand-by state in which the memory cells are not selected. As shown in FIG. 6, a stand-by current Icc2 increases due to the influence of the inter-band tunnel current as the power source voltage of the MOS transistor becomes higher. Particularly when the power source voltage reaches a certain high voltage, the stand-by current is likely to increase drastically.

It will be hereby assumed, for example, that when the step-up voltage is 4.5V, a stand-by current of 50 fA (50× $10^{-15}$A) per $\mu$m gate width ($10^{-6}$m) of the MOS transistor flows as an inter-band tunnel current (inter-band leakage current). Assuming that the total gate width of the MOS transistors in the cell array to which the step-up voltage is applied at this time is W ($\mu$m) and an efficiency of the circuit of the step-up voltage generating unit is 25%, the increment of the stand-by current brought about due to the inter-band tunnel current can be expressed by the following formula:

$$\Delta Icc2 = (50fA \times W\ \mu m) \times 4$$

Assuming hereby that the inter-band tunnel current is the same at the integrated storage capacity of the three generations with each other (that is, integrated storage capacity of 64 Mbits, 256 Mbits and 1 Gbit) and that the total gate width of the MOS transistors in the cell array to which the step-up voltage is applied shifts as tabulated in the following Table 1, the increment of the stand-by current brought about due to the influences of the inter-band tunnel current can be expressed as in FIG. 7.

TABLE 1

| Total Gate Width versus Integrated Storage Capacity | | | |
|---|---|---|---|
| Integrated Storage Capacity (bit) | 64 M | 256 M | 1 G |
| Total Gate Width ($\mu$m) | 125 × $10^4$ | 250 × $10^4$ | 500 × $10^4$ |

As is obvious from FIG. 7, the influence of the increment of the stand-by current brought about due to the influence of the inter-band tunnel current reaches the level that cannot be neglected when the integrated storage capacity becomes higher. In other words, as the integrated storage capacity of the semiconductor. integrated circuit becomes higher, an increase in the stand-by current resulting from the use of the step-up voltage for the word decoder unit, the bit line signal generating unit, and the like, of the cell array becomes more remarkable. Consequently, another problem occurs in that power consumption of the memory cells at the time of stand-by state increases.

SUMMARY OF THE INVENTION

In view of the problem described above, an object of the present invention is to provide a semiconductor integrated circuit which is capable of suppressing an increase in power consumption of the memory cells at the time of a stand-by state when the step-up voltage is used for the word decoder unit, the bit line transfer signal generating unit, etc., of the cell array.

In order to solve the problems described above, a semiconductor integrated circuit according to the present invention includes a memory cell block containing a plurality of memory cells and a core circuit portion for selecting and activating a specific memory cell inside this memory cell block, is constituted so that a step-up voltage is supplied to the core circuit portion at the time of an activated state. The semiconductor integrated circuit further includes a step-up voltage lowering unit for lowering the step-up voltage by a predetermined value, and a means for selectively supplying the step-up voltage and an output voltage of the step-up voltage lowering unit to the core circuit portion.

When the semiconductor device of the present invention preferably has a dynamic random access memory containing a plurality of MOS transistors, a value of the step-up voltage is determined on the basis of a threshold voltage for operating these MOS transistors.

Further, preferably, in the semiconductor integrated circuit of the present invention, the means for selectively supplying the step-up voltage and the output voltage of the step-up voltage lowering unit sets a period in which the memory cell block is not selected, as a period for supplying the output voltage of the step-up voltage lowering unit.

Further, preferably, in the semiconductor integrated circuit of the present invention, the step-up voltage lowering unit is applied to only a circuit portion which outputs a low voltage level under the state in which the memory cell block is not selected, in the core circuit portion described above.

Further, preferably, in the semiconductor integrated circuit of the present invention, when the memory cell block described above has a plurality of operation blocks, the step-up voltage lowering unit is independently applied to each of these operation blocks in the memory cell block.

Further, preferably, in the semiconductor integrated circuit of the present invention, when the memory cell block has a plurality of operation blocks, the timing for lowering the step-up voltage and the timing for raising again the step-up voltage which is in a lowered state are determined by a bit line transfer signal for selecting a specified operation block among these operation blocks.

Further, preferably, in the integrated circuit device of the present invention, when the memory cell block has a plurality of operation blocks, the step-up voltage lowering unit is applied to only a part of the core circuit portion in these operation blocks.

Further, preferably, in the integrated circuit device of the present invention, when the core circuit portion includes a plurality of MOS transistors, the step-up voltage lowering unit is not applied to a circuit portion for applying a back bias of these MOS transistors.

Further, preferably, the semiconductor integrated circuit according to the present invention comprises a memory cell array including a plurality of memory cells; a circuit portion for selecting one of these memory cells in the memory cell array, and receiving a step-up voltage in a first time period; a step-up voltage lowering means for lowering the step-up voltage by a predetermined value; and a means for selectively supplying one of the step-up voltage and an output voltage of the step-up voltage lowering means to the circuit portion.

According to the semiconductor integrated circuit of the present invention, the voltage to be supplied to the core circuit portion of a cell array can be made lower than the step-up voltage during stand-by period of the memory cells, so that an increase in the stand-by current brought about due to an inter-band tunnel current can be restricted. In other words, because an increase in the stand-by current due to the inter-band tunnel current, which occurs when the step-up voltage is applied between the source and the drain in the form of the back bias to a plurality of semiconductor devices Inside the core circuit portion such as a plurality of transistors, can be restricted, an increase in power consumption resulting from the stand-by current can be restricted.

When the memory cell block comprises a plurality of operation blocks in the semiconductor integrated circuit of the present invention, the step-up voltage lowering unit is applied to only a part of the cell circuit portion inside these operation blocks and in this way, the increase of a chip area can be kept minimal. When the core circuit portion contains a plurality of MOS transistors, for example, an increase in the chip area can be restricted by not disposing the step-up voltage lowering unit in the circuit portion for applying the back bias to these MOS transistors.

BRIEF DESCRIPTION OF THE DRAWINGS

The above objects and features of the present invention will be more apparent from the following description of some preferred embodiments with reference to the accompanying drawings, wherein.

DESCRIPTION OF THE PREFERRED EMBODIMENTS

Hereinafter, preferred embodiments of the present invention will be explained with reference to the accompanying drawings (FIGS. 8 to 18).

Figure 8:
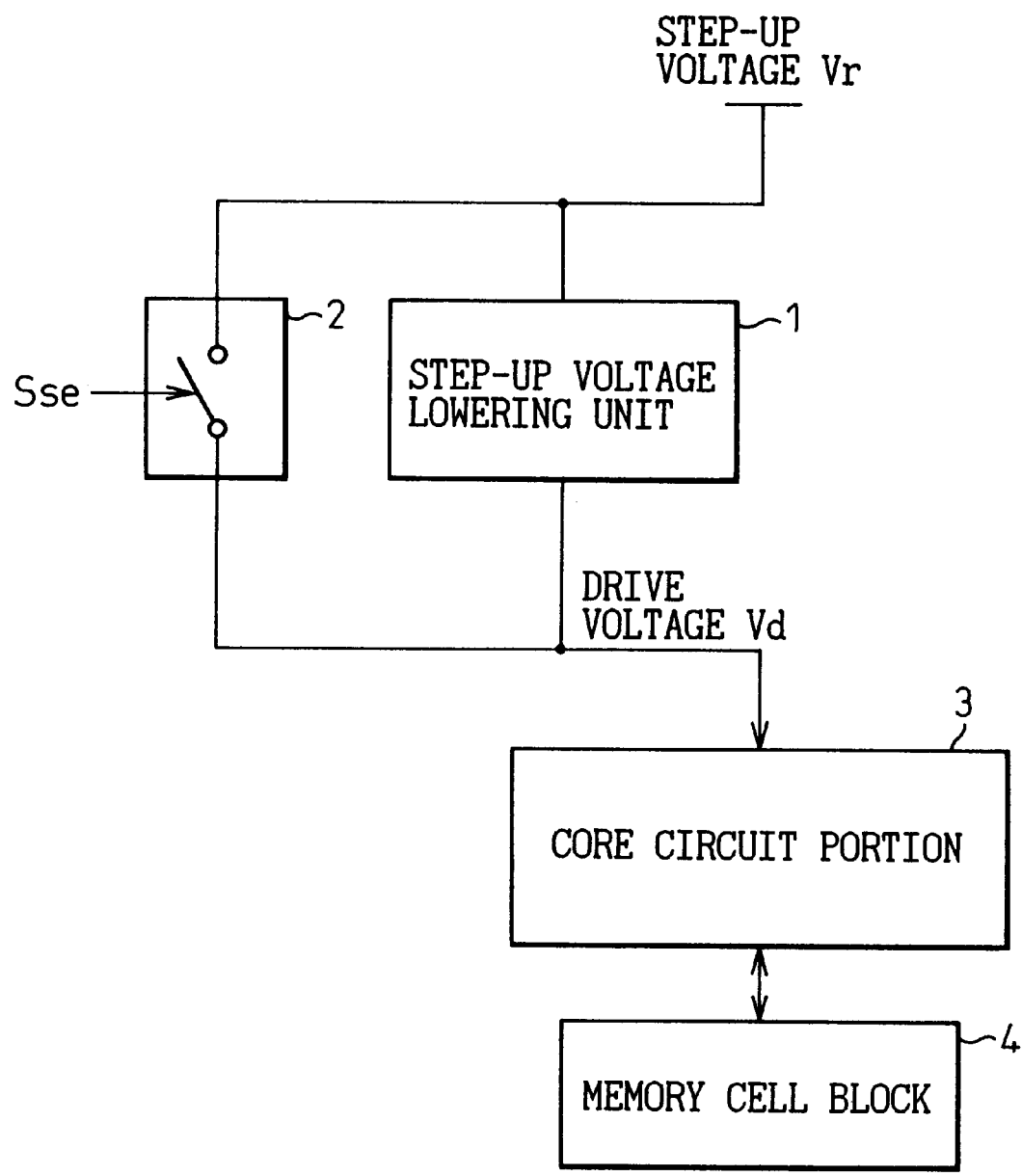
FIG. 8 is a block diagram showing an embodiment based on the basic principle of the present invention.

FIG. 8 is a block diagram of an embodiment based on the basic principle of the present invention. Here, the construction of a semiconductor integrated circuit will be shown in a simplified form.

The embodiment of the semiconductor integrated circuit of the present invention shown in FIG. 8 includes a memory cell block (i.e., memory cell array) 4 including a plurality of memory cells and a core circuit portion 3 for selecting a specified memory cell inside this memory cell block 4 and activating it. A step-up voltage Vr (since the embodiment is directed to a conventional semiconductor integrated circuit, the step-up voltage will be expressed as "Vr", in place of "SVii" described above) is supplied to the core circuit portion 3 at the time of the activated state (i.e., the step-up voltage is supplied to the core circuit portion 3 as a drive voltage Vd). Further, the semiconductor integrated circuit of this embodiment includes a step-up voltage lowering unit 1 for lowering the step-up voltage by a predetermined value (e.g, for lowering the drive voltage vd in FIG. 8 by a predetermined value) and a means for selectively supplying the step-up voltage and an output voltage of the step-up voltage lowering unit 1 to the core circuit portion 3. A step-up voltage lowering period setting unit 2 for setting a period in which the output voltage of the step-up voltage lowering unit 1 is supplied to the core circuit portion 3 by using a selecting signal Sse (for example, a bit line transfer signal), etc., is shown disposed typically as the above means in FIG. 8.

When the semiconductor integrated circuit of the embodiment shown in FIG. 8 is preferably constituted by a DRAM containing a plurality of MOS transistors, a value of the step-up voltage described above is decided on the basis of a threshold voltage for operating these MOS transistors.

Further, preferably, the step-up voltage lowering period setting unit 2, etc., in the embodiment of the semiconductor integrated circuit of the present invention shown in FIG. 8 set a period of a non-selected state of the memory cell block 4, as a period for supplying the output voltage of the step-up voltage lowering unit 1.

Further, preferably, in the embodiment of the semiconductor integrated circuit of the present invention shown in FIG. 8, the step-up voltage lowering unit 1 is applied to only a circuit portion which outputs a low voltage level when the memory cell block 4 is in the non-selected state, in the core circuit portion 3 described above.

Further, preferably, in the embodiment of the semiconductor integrated circuit of the present invention shown in FIG. 8, when the memory cell block 4 has a plurality of operation blocks, the step-up voltage lowering unit 1 is applied independently to each operation block inside these operation blocks.

Further, preferably, in the embodiment of the semiconductor integrated circuit of the present invention shown in FIG. 8, when the memory cell block 4 has a plurality of operation blocks, the timing for lowering the step-up voltage and the timing for raising again the step-up voltage which is in a lowered state are decided by a block selecting signal for selecting a specified operation block among a plurality of operation blocks.

Further, preferably, in the semiconductor integrated circuit of the present invention shown in FIG. 8, when the memory cell block has a plurality of operation blocks, the step-up voltage lowering unit 1 is applied to only a part of the core circuit portion inside these operation blocks.

Further, preferably, in the semiconductor integrated circuit of the present invention shown in FIG. 8, when the core circuit portion 3 includes a plurality of MOS transistors, the step-up voltage lowering unit 1 is not applied to a circuit portion for applying a back bias of these MOS transistors.

Figure 9:
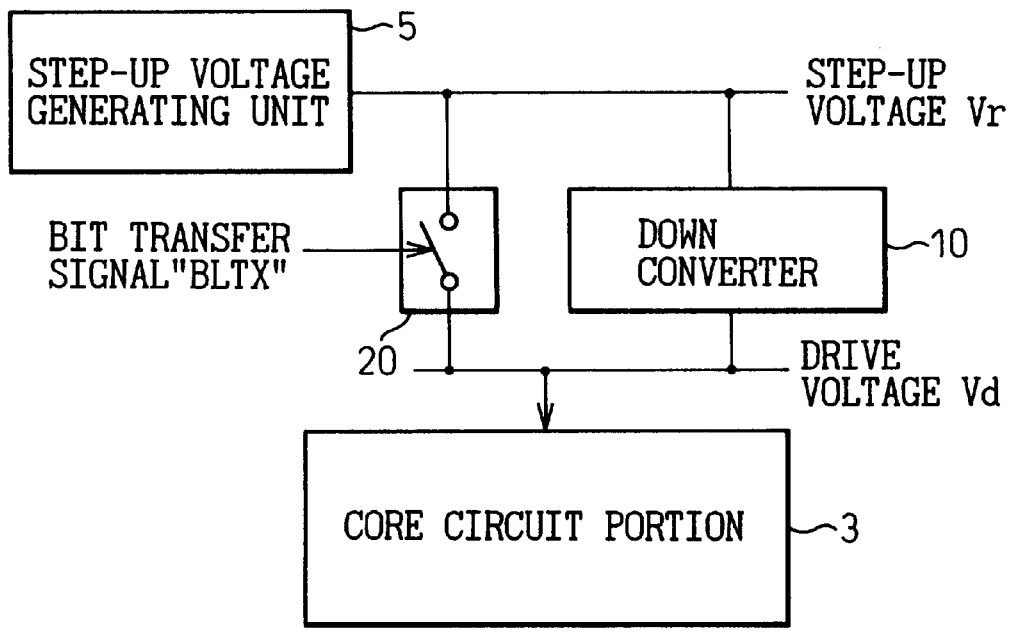
FIG. 9 is a block circuit diagram showing an example of a basic circuit according to the embodiment shown in FIG. 8.
Figure 10:
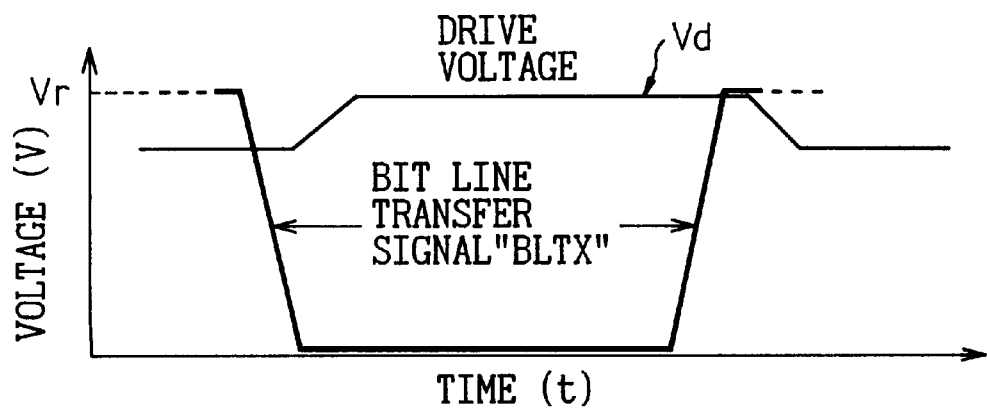
FIG. 10 is an operation voltage waveform diagram for explaining an operation of a basic circuit of FIG. 9.

FIG. 9 is a circuit block diagram showing an example of the basic circuit according to the embodiment shown in FIG. 8, and FIG. 10 is an operation voltage waveform diagram for explaining an operation of a basic circuit of FIG. 9. Here, the features and functions of the present invention will be explained in detail by referring to the example of the basic circuit related to the principle of the present invention. Therefore, in this case, too, the construction of the semiconductor integrated circuit will be illustrated in the simplified form in the same way as in FIG. 8. Furthermore, like reference numerals will be used to identify constituent elements similar to those already described.

The semiconductor integrated circuit according to the present invention discloses concrete measures for restricting an increase in power consumption at the time of a stand-by state (i.e., stand-by period) by lowering the step-up voltage, described above, of the memory cells at the time of a stand-by state, by taking into consideration the fact that the step-up voltage need not be supplied during the stand-by state in which the memory cells inside the memory cell block are not selected.

Figure 1:
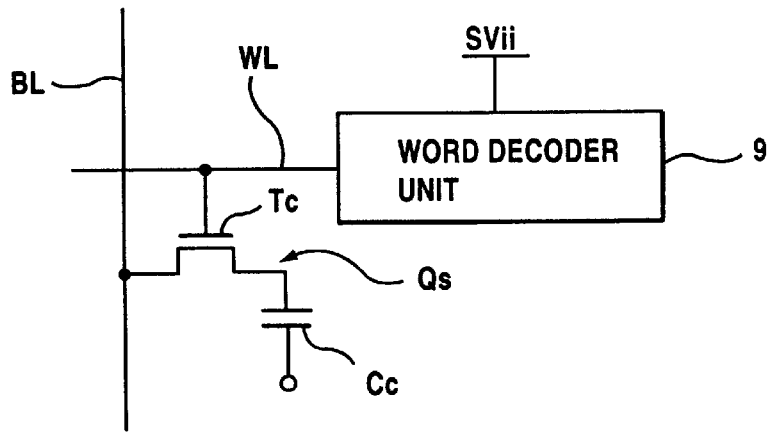
FIG. 1 is a block circuit diagram showing a construction of a cell transistor in a conventional DRAM.
Figure 2:
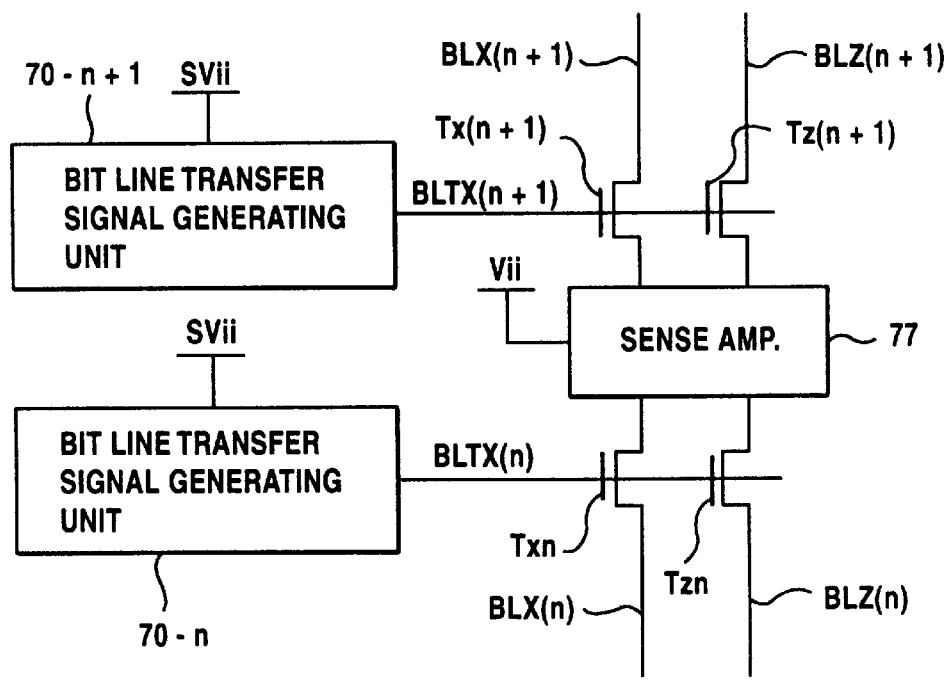
FIG. 2 is a block circuit diagram showing a construction of a bit line transfer transistor in an ordinary DRAM.
Figure 3:
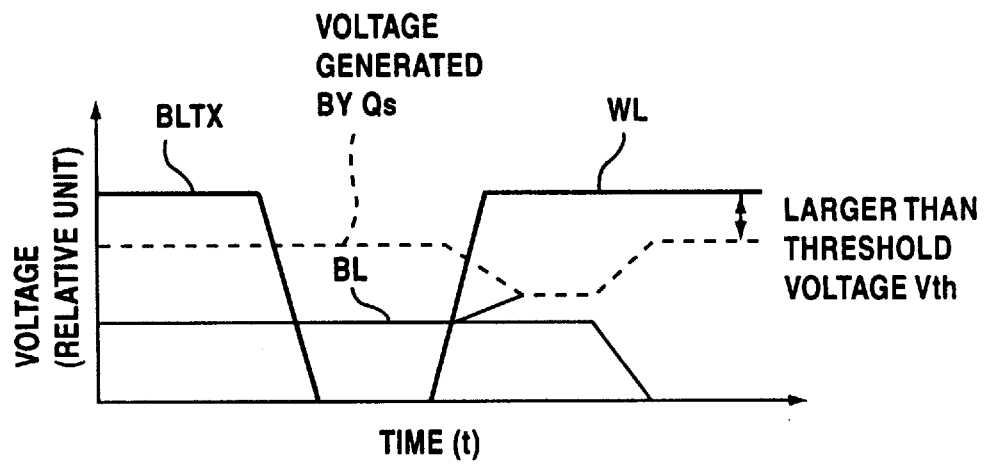
FIG. 3 is a graph showing an operation voltage waveform at the time of read operation of cell data in an ordinary DRAM.
Figure 4:
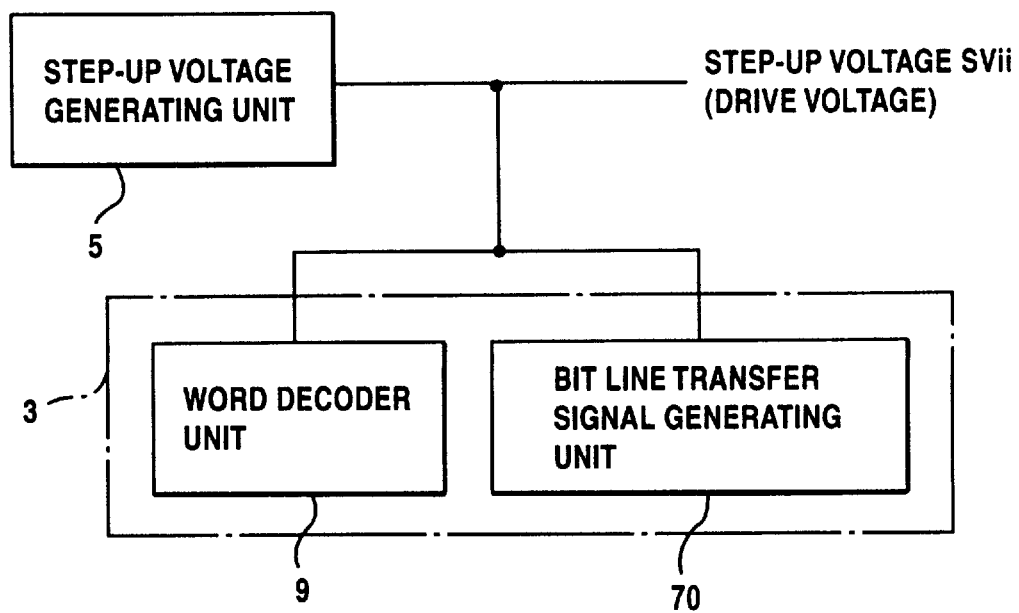
FIG. 4 is a block circuit diagram showing a state in which a step-up voltage is used in a semiconductor integrated device according to the prior art.
Figure 5:
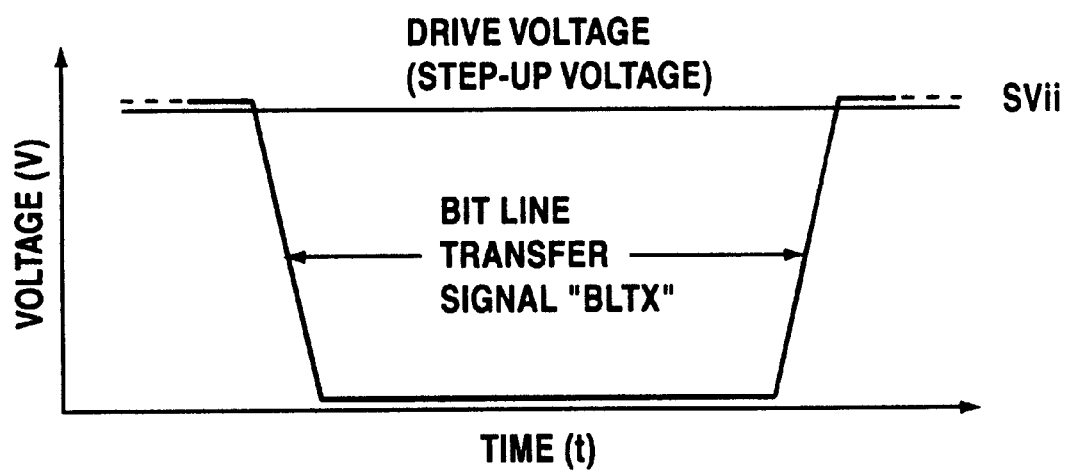
FIG. 5 is an operation voltage waveform diagram showing the relationship between a step-up voltage and a circuit selecting signal in a semiconductor integrated circuit according to the prior art.
Figure 6:
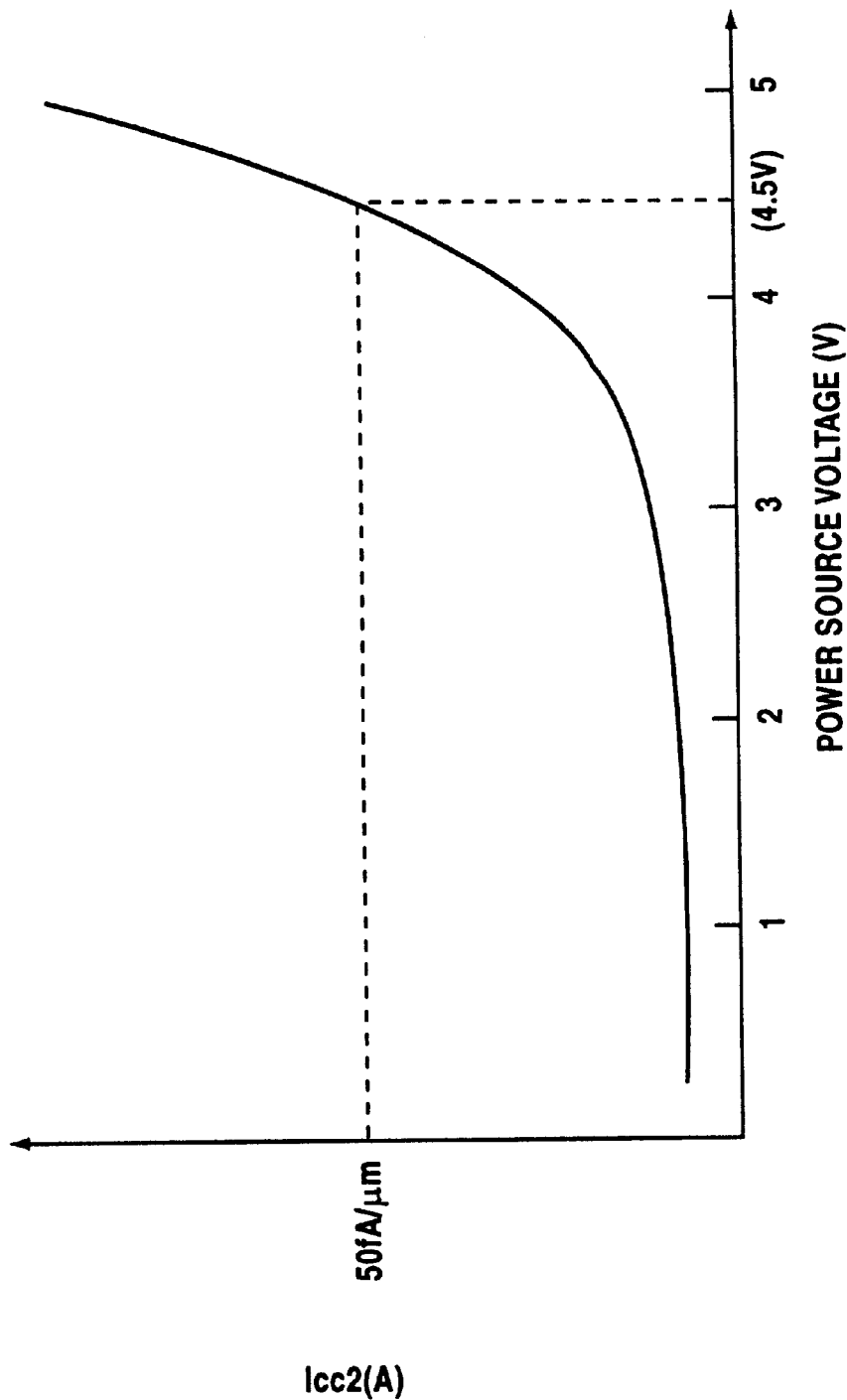
FIG. 6 is a graph showing the relationship between a power source voltage of an MOS transistor and an inter-band tunnel current.
Figure 7:
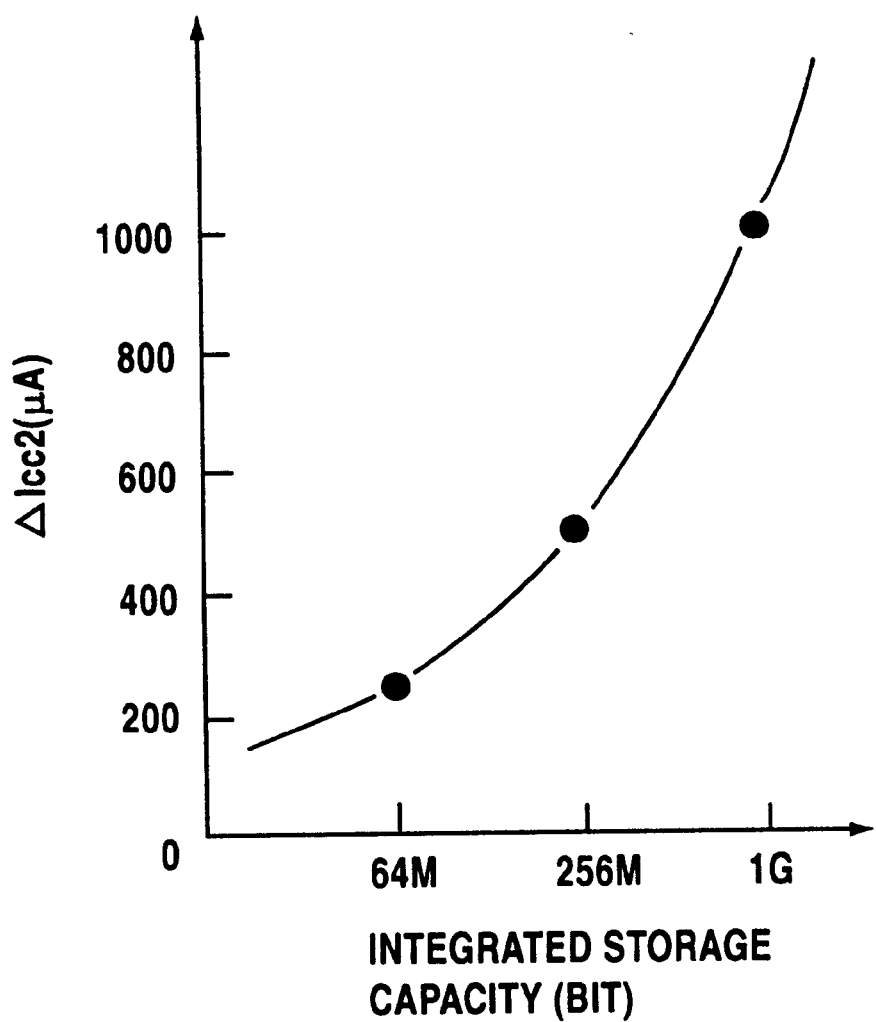
FIG. 7 is a graph showing the mode of an increase in a stand-by current in the prior art.

The basic circuit shown in FIG. 9 includes a down converter (voltage lowering circuit portion) 10 for lowering the step-up voltage by a predetermined value (e.g., to a voltage at which the inter-band tunnel current does not occur) and outputting a drive voltage Vd as the step-up voltage lowering unit 1 shown in FIG. 1. Furthermore, this basic circuit includes a changeover switching portion 20 controlled by a bit line transfer signal BLTX as a means (e.g., step-up voltage lowering period setting unit 2 shown in FIG. 1) for selectively supplying the afore-mentioned step-up voltage and the output voltage of the step-up voltage lowering unit 1 to the core circuit portion 3.

The step-up voltage Vr output from a step-up voltage generating portion 5 is converted to the drive voltage Vd for driving the core circuit portion 3 through the changeover switching portion 20 and the down converter 10. Here, since the bit line transfer signal BLTX occurs when a specified operation block inside the chip, in which the semiconductor integrated circuit is formed, is in the activated state (i.e., activated period) and turns on the changeover switching portion 20, the down converter 10 does not operate in this activated state and the step-up voltage per se is supplied to the core circuit portion 3. On the other hand, during the stand-by period where the memory cell is not selected, the bit line transfer signal BLTX is not generated and the changeover switch portion 20 is turned OFF in consequence. The down converter 10 operates at this time, and the voltage obtained by lowering the step-up voltage is supplied as the drive voltage to the core circuit portion 3.

The operation voltage waveform diagram of FIG. 10 shows the operation of the circuit of FIG. 9. As is obvious from FIG. 10, the step-up voltage is supplied to the core circuit portion 3 only during the period in which the bit line transfer signal BLTX is in the activated state, and the voltage obtained by lowering the step-up voltage to a voltage at which the inter-band tunnel current does not occur, is supplied at other periods to the core circuit portions 3.

Therefore, according to the embodiment based on the basic principle of the present invention, the voltage to be supplied to the core circuit portion of the cell array can be made lower than the step-up voltage during the stand-by period of the memory cells, and an increase in the stand-by current brought about due to the inter-band tunnel current can be restricted. In other words, an increase in the stand-by current due to the inter-band tunnel current, which is generated when the step-up voltage is applied in the form of back bias to a plurality of semiconductor devices inside the core circuit portion such as a plurality of transistors, can be restricted and consequently, an increase in power consumption resulting from this stand-by current can be restricted.

Further, when the memory cell block has a plurality of operation blocks in the embodiment based on the basic principle of the present invention, an increase in the chip area can be minimized by applying the step-up voltage lowering unit to only a part of the cell circuit portion of these operation blocks. When the core circuit portion includes a plurality of MOS transistors, for example, the step-up voltage lowering unit described above is not disposed in the circuit portion for applying the back bias of these MOS transistors and in this way, an increase in the chip area can be restricted.

Figure 11:
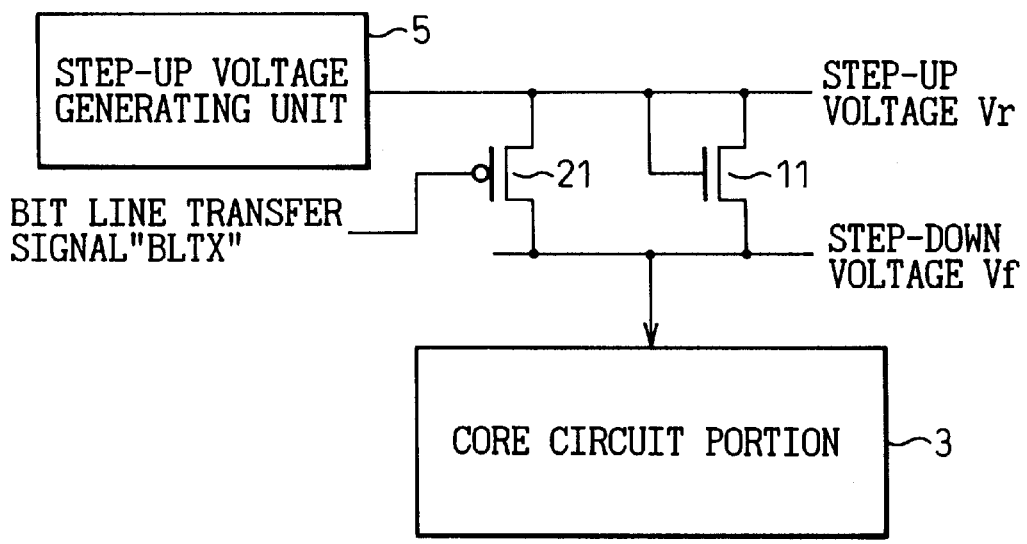
FIG. 11 is a circuit diagram showing a construction of the first preferred embodiment of the present invention.

FIG. 11 is a circuit diagram showing the construction of the first preferred embodiment of the present invention. However, this drawing shows the construction of the semiconductor integrated circuit in the simplified form in the same way as in FIG. 9.

In FIG. 11, the changeover switching portion 20 (FIG. 9) comprises a switching pMOS transistor 21. The gate voltage of this switching pMOS transistor 21 is controlled by the bit line transfer signal BLTX which generates the step-up voltage at the time of stand-by of the memory cell and generates a voltage substantially equal to the ground potential under the activated state. Further, the down converter 10 (FIG. 9) comprises an nMOS transistor 11. In this case, since the gate and the drain of the nMOS transistor 11 for the down converter are connected in this case, this transistor functions as a diode. The switching pMOS transistor 21 is turned OFF under the stand-by state of the memory cells, the nMOS transistor 11 for the down converter functions as the diode, and this diode lowers the drive voltage to a potential at which the inter-band tunnel current does not occur.

Figure 12:
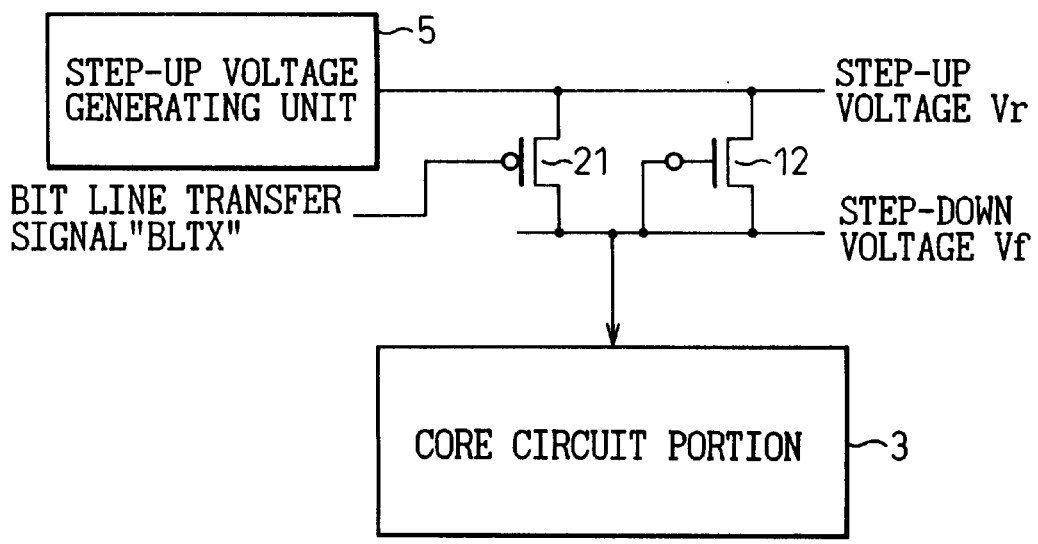
FIG. 12 is a circuit diagram showing a construction of the second preferred embodiment of the present invention.

FIG. 12 is a circuit diagram showing the construction of the second embodiment of the present invention. This embodiment uses a pMOS transistor 12 for the down converter in place of the nMOS transistor 11 for the down converter of the first embodiment shown in FIG. 8. Since the gate and the drain of the pMOS transistor 11 for the down converter are connected, the transistor 11 functions as the diode in the same way as in the first embodiment described above. Therefore, under the stand-by state of the memory cells, the switching pMOS transistor 21 is turned OFF and the pMOS transistor 12 for the down converter functions as the diode, and this diode lowers the drive voltage to a potential at which the inter-band tunnel current does not occur. According to this second preferred embodiments, both of the step-up voltage lowering unit and the step-up voltage lowering period setting means as the constituent elements of the present invention can be constituted by pMOS transistors.

Figure 13:
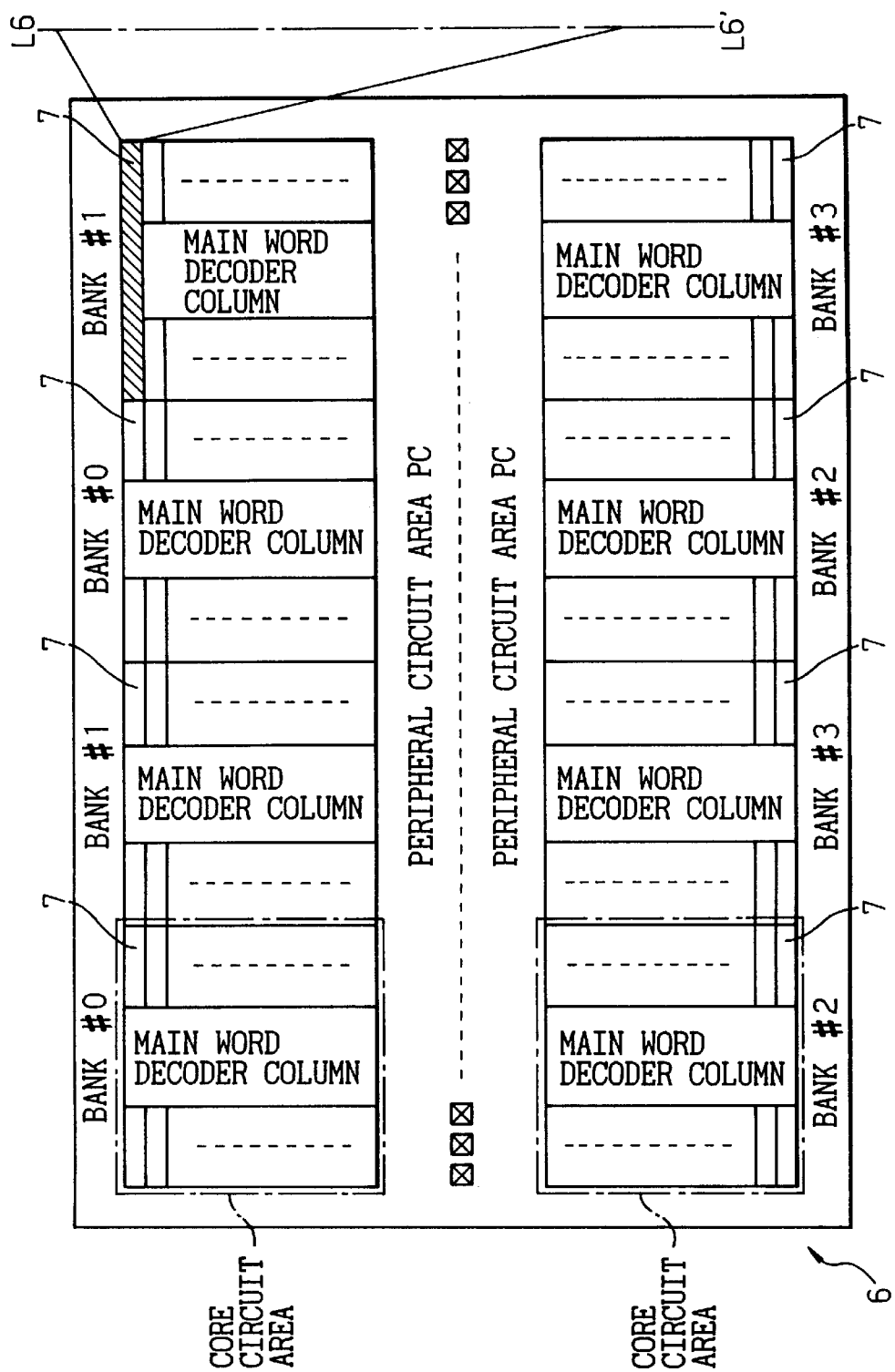
FIG. 13 is a schematic view schematically showing an overall construction of a chip to which the semiconductor integrated circuit of the present invention is applied.
Figure 14:
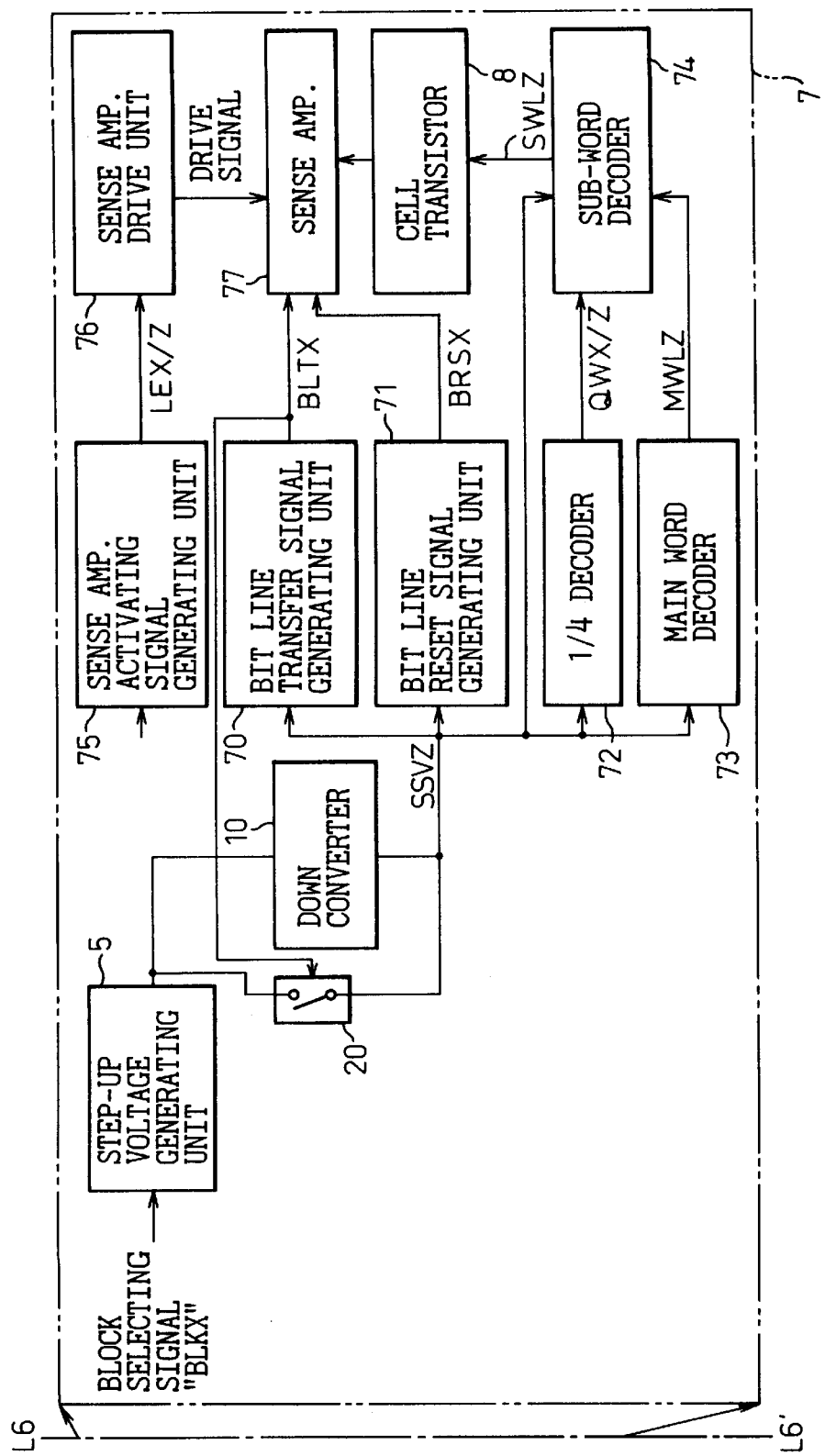
FIG. 14 is a block circuit diagram showing the details of a cell array and a sense amplifier block in one bank inside a chip shown in FIG. 13.
Figure 15:
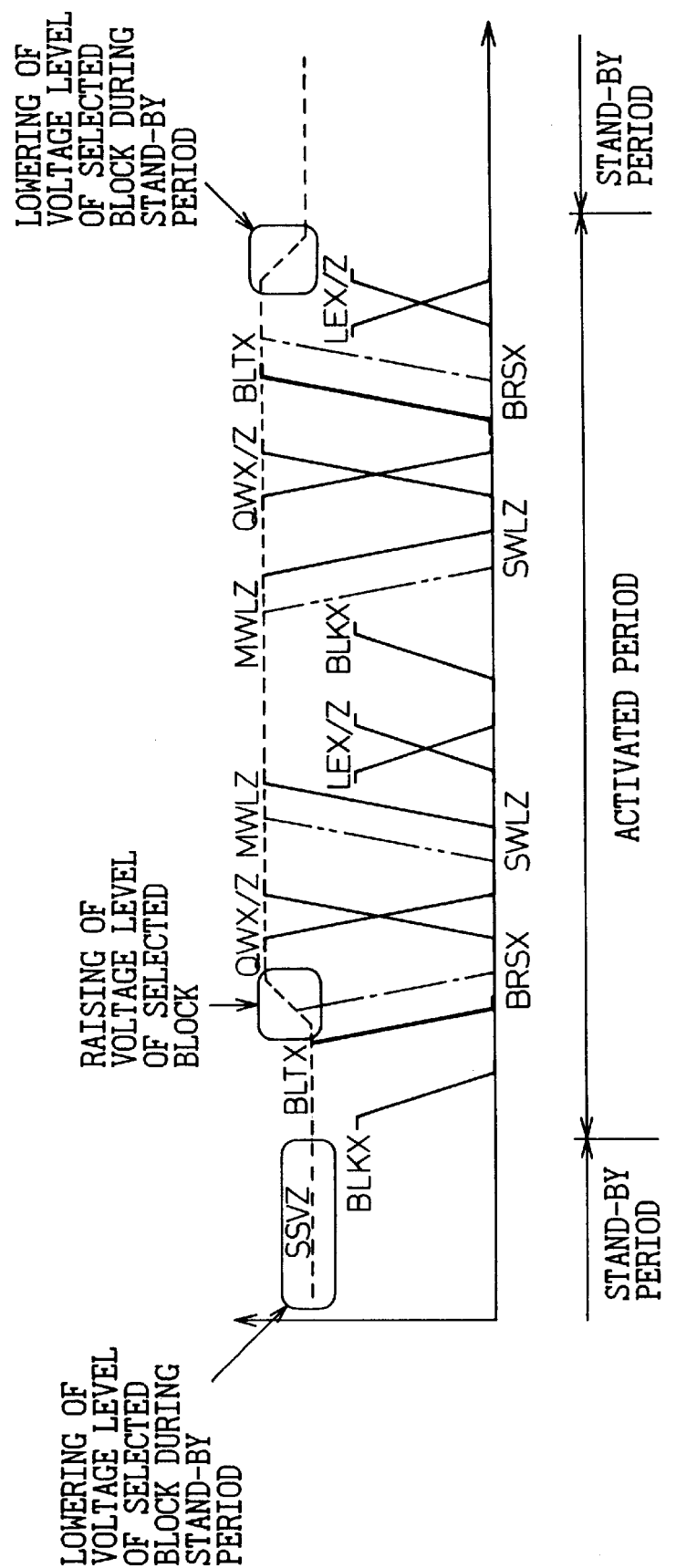
FIG. 15 is an operation voltage waveform diagram for explaining an operation of a cell array shown in FIG. 14.

FIG. 13 is a schematic view schematically showing the overall construction of a chip to which the semiconductor integrated circuit of the present invention is applied; FIG. 14 is a block circuit diagram showing the details of a cell array and a sense amplifier block in one bank inside the chip shown in FIG. 13; and FIG. 15 is an operation voltage waveform diagram for explaining an operation of a cell array shown in FIG. 15.

Each of a plurality of chips 6 shown in FIG. 13 comprises four banks (two rows of banks #0 and #1, and two rows of banks #2 and #3). Each bank is divided into halves (each of which will be hereinafter referred to as a "half bank"), and is disposed at eight positions on both sides of the shorter sides of the chip. A main word decoder column (MWDECS) is disposed at the center of each pair of half banks, and cell arrays and sense amplifier blocks 7 exist on both sides of this main word decoder column.

Each of these cell arrays and the sense amplifier blocks 7 are activated by the block selecting signal BLKS which is determined by a peripheral circuit. Therefore, non-selected blocks which are not activated by the block selecting signal BLKS do not operate. The core circuit portion comprising these main word decoder columns, cell arrays and sense amplifier blocks, etc, exists in a core circuit area CC. On the other hand, a peripheral circuit area PC in which the peripheral circuits are formed exists at the peripheral portion of the core circuit portion.

The cell array and the sense amplifier block (hatched portion in FIG. 13) selected by the block selecting signal BLKS comprise the circuit shown in FIG. 14. In the bit line transfer signal generating portion (BLTGEN) 70, the bit line reset signal generating portion (BRSGEN) 71, and those circuits which output the step-up voltage such as a ¼ decoder (QWDEC) 72, a main word decoder (MWDEC) 73 and a sub-word decoder (SWDEC) 74 constituting the word decoder unit among these circuits, the step-up voltage generating unit 5 functioning as a circuit for controlling the drive voltage inside the core circuit portion of each memory block, that is, a block independent drive voltage generating unit (SSVGEN), controls the drive voltage. This block independent drive voltage generating unit is controlled by the block selecting signal BLKS.

To execute a write operation to a specified memory cell, the ¼ decoder 72 described above outputs a word line ¼ decoding signal QWX/Z and the main word decoder 73 outputs a main word decoding signal MWLZ. A sub-word decoding signal SWLZ is output from the sub-word decoder 74 by executing a logic operation between these decoding signals.

In the circuit shown in FIG. 14, the voltage obtained by lowering the step-up voltage by the down converter 10 is applied as the voltage of the drive power source to the non-selected blocks which are not selected by the block selecting signal BLKX and during the standby state of the memory cells in which the specified memory cell is not selected by the bit line transfer signal BLTX, and the increase of the stand-by current brought about due to the influence of the inter-band tunnel current can be restricted. On the other hand, the operation block selected under the activated state receives the change of the output voltage level of the block selecting signal BLKX, and the voltage of the voltage level of the step-up voltage is given as the voltage of the drive power source. Accordingly, the step-up voltage level is applied to the gate voltage of each cell transistor 8 inside the memory cell, the bit line transfer signal BLTX output from the bit line reset signal generating portion 71 and the bit line reset signal BRSX output from the bit line reset signal generating portion 71.

In the circuit shown in FIG. 14, further, there is provided a sense amplifier drive unit 76 for supplying a drive signal having a voltage level of the reference power source to the sense amplifier 77. Further, a sense amplifier signal activating signal generating unit 75 is disposed so as to supply a sense amplifier activating signal LEX/Z to this sense amplifier drive unit 76.

An operation voltage waveform diagram of FIG. 15 shows the operation of the cell array shown in FIG. 14. As is obvious from FIG. 15, the level of the step-up voltage is given as the voltage of the drive power source during the period (i.e., activated period) in which the block is selected by the block select signal BLKX and is in the activated state. Therefore, the output voltage levels of the bit line transfer signal BLTX, the bit line reset signal BRSX, etc, become the step-up voltage level itself. On the other hand, during the stand-by period in which the block is not selected and is in the stand-by state, the voltage obtained by lowering the step-up voltage by the down converter, etc., is given as the voltage of the drive power source.

Figure 16:
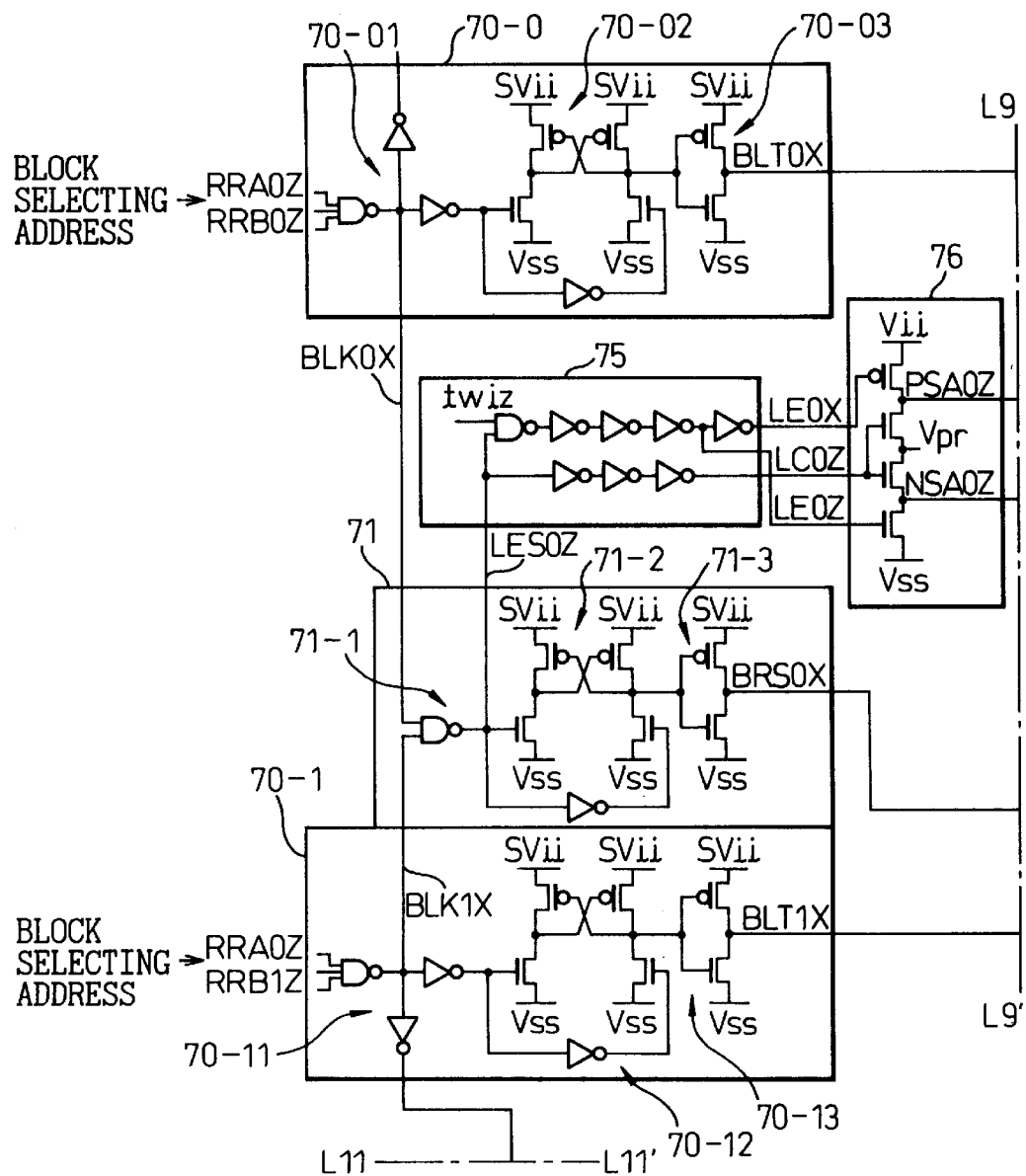
FIG. 16 is a circuit diagram (part 1) showing a specific structural example of a cell array and a sense amplifier shown in FIG. 14.
Figure 17:
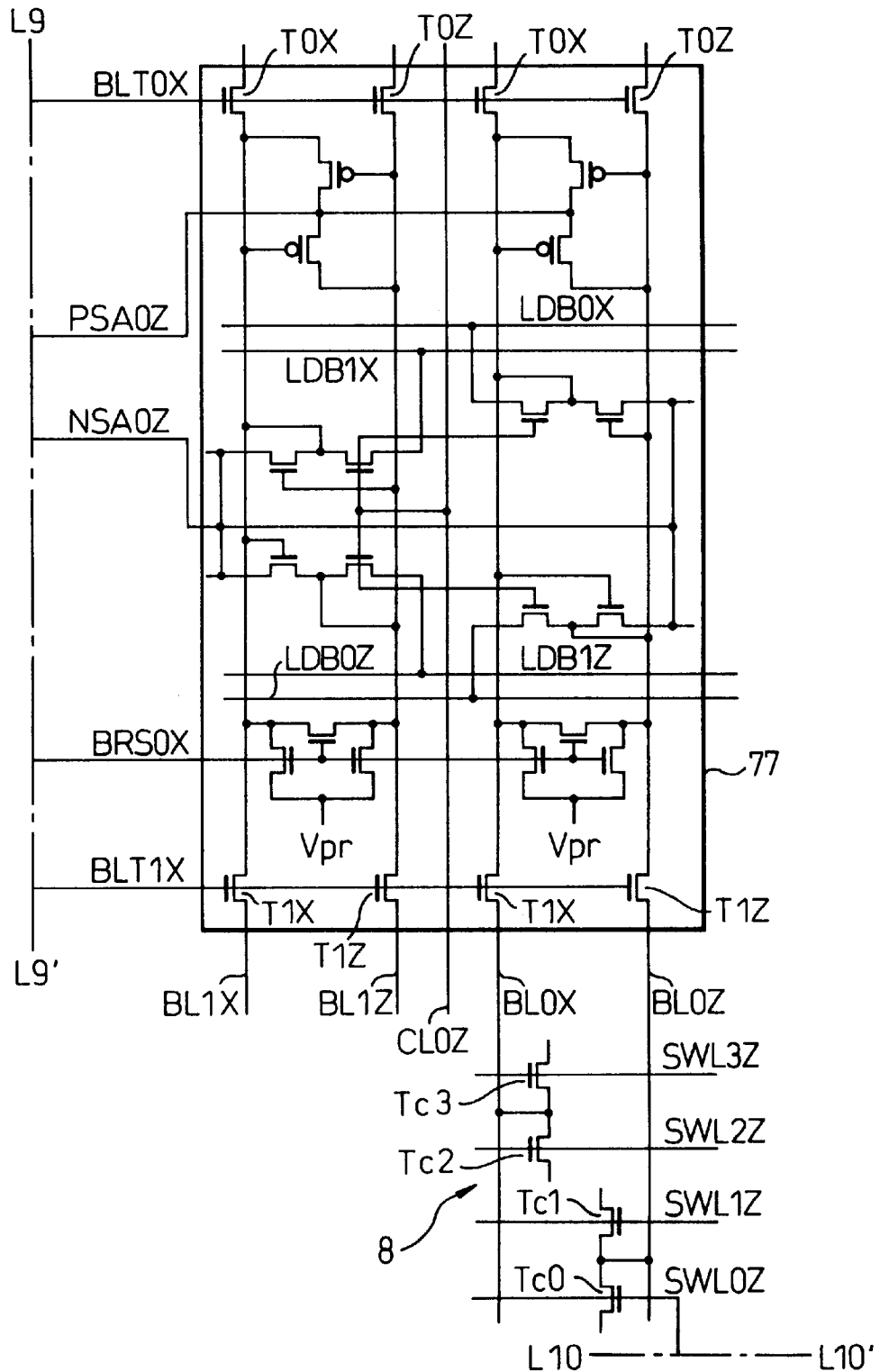
FIG. 17 is a circuit diagram (part 2) showing a specific structural example of a cell array and a sense amplifier shown in FIG. 14.
Figure 18:
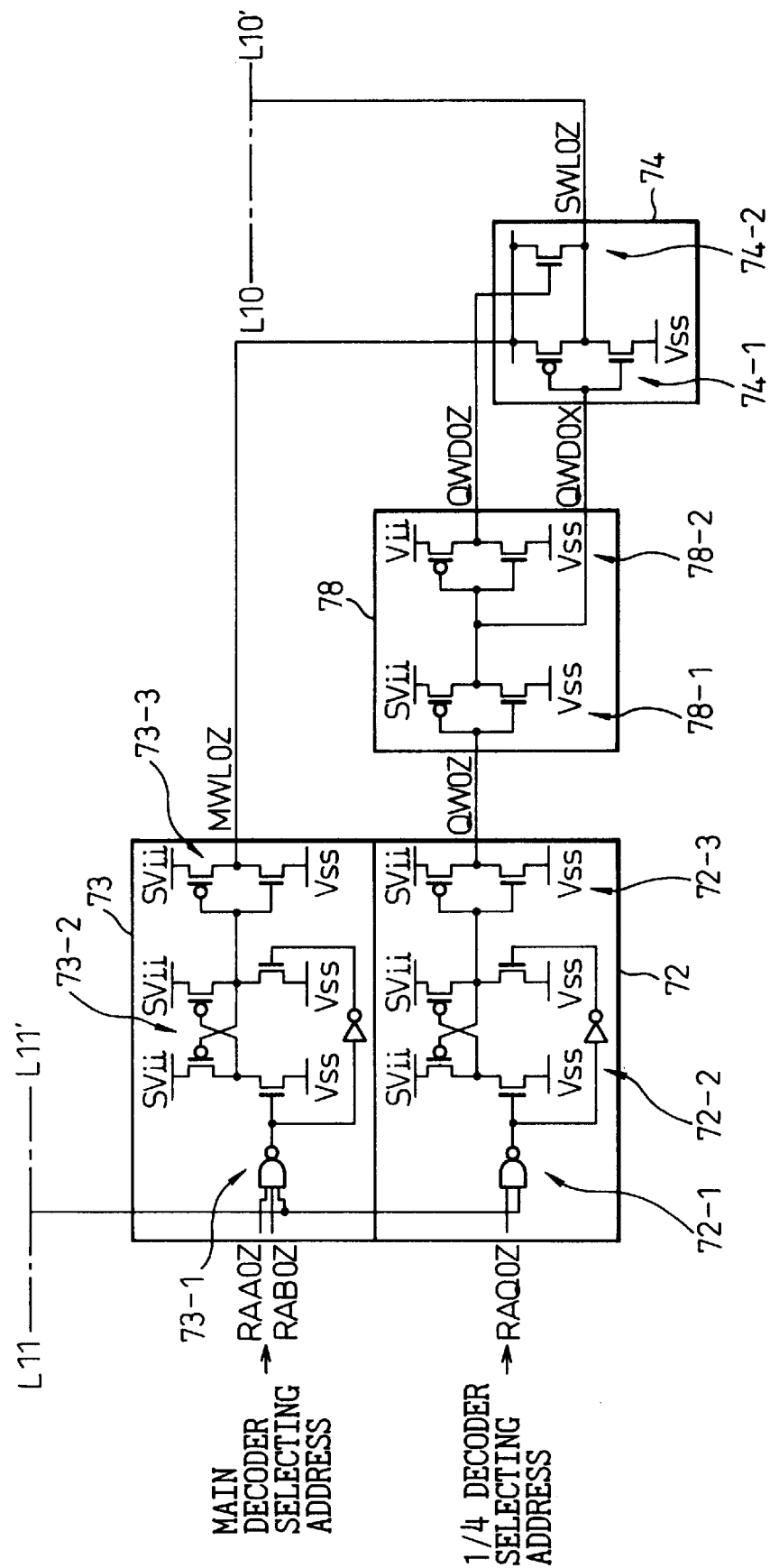
FIG. 18 is a circuit diagram (part 3) showing a specific structural example of a cell array and a sense amplifier block shown in FIG. 14.

FIGS. 16, 17 and 18 are part 1, part 2 and part 3 of a circuit diagram showing the specific structural examples of the cell array and the sense amplifier block shown in FIG. 14, respectively.

FIG. 16 shows the a concrete circuit structural example of the two bit line transfer signal generating units 70-0 and 70-1, the bit line reset signal generating unit 71, the sense amplifier activating signal generating unit 75 and the sense amplifier drive unit 76.

The circuit constructions of the two bit line transfer signal generating units 70-0 and 70-1 are substantially the same.

The bit line transfer signal generating unit 70-0 comprises a logic circuit portion 70-01 for processing the block select address to be input, a level shift circuit portion 70-02 for shifting the signal waveform (from Vii through SVii) and an inverter 70-03 for outputting the bit line transfer signal (BLT0X). Similarly, the bit line transfer signal generating unit 70-1 comprises a logic circuit portion 70-11 for processing a block select address to be input, a level shift circuit portion 70-12 and an inverter 70-13 for outputting the bit line transfer signal (BLT1X).

The bit line reset signal generating unit 71 shown in FIG. 16 comprises a logic circuit portion 71-1 for processing a plurality of block selecting signals (BLK0X, BLK1X), a level shift circuit portion 71-2 for shifting the level of the signal waveform and an inverter 71-3 for outputting a bit line resetting signal (BRS0X).

The sense amplifier activating signal generating unit 75 comprises a plurality of inverter devices for outputting a sense amplifier latch activating signal (LE0X/LE0Z). Here, the timing in which the sense amplifier latch activating signal (LE0X/LE0Z) is output is decided by a sense amplifier latch timing signal (twiz).

The sense amplifier drive unit 76 comprises a plurality of MOS transistors for outputting a drive signal (PSA0Z) or a drive signal (NSA0Z) by receiving the sense amplifier latch activating signal (LE0X/LE0Z) described above.

In FIG. 17, a shared type sense amplifier 77 is shown disposed. This sense amplifier 77 is constituted so as to read out the data from all the transistors (Tc0 to Tc3) inside the memory cell on one word line by the drive signal from the sense amplifier drive unit 76 (FIG. 16).

In FIG. 18, there are shown disposed a ¼ decoder 72, a main word decoder 73 and a sub-word decoder 74 so as to write the data into a specific memory cell inside the memory cell selected by the block selecting signal. In FIG. 18, there is further shown disposed a ¼ decode signal amplifying unit 78 which comprises amplification circuit portions 78-1 and 78-2, for generating two kinds of ¼ decode signals (QWD0Z and QWD0X) on the basis of the word line ¼ decode signal (QW0Z) from the ¼ decoder 72 described above.

The explanation will be given in further detail. The ¼ decoder 72 comprises a logic circuit portion 72-1 for processing the input ¼ decoder selecting address, a level shift circuit portion 72-2 for level shifting the signal waveform and an inverter 72-3 for outputting the word line ¼ decode signal (QW0Z).

The main word decoder 73 comprises a logic circuit portion 73-1 for processing the inputted main decoder selecting address, a level shift circuit portion 73-2 for level shifting the signal waveform and an inverter 73-3 for outputting the main word decoding signal (MWL0Z).

The sub-word decoder 74 comprises selecting portions 74-1 and 74-2 for outputting a sub-word line decoding signal (SWL0Z) on the basis of the main word line decoding signal from the main word decoding signal and two kinds of ¼ decoding signals (QWD0Z and QWD0X).

When the sub-word line decoding signal outputted from the sub-word decoder 74 is input to the gate of a specific cell transistor inside the memory cell block, the data read/write operations from and to this memory cell are executed.

As described above, according to the preferred embodiment of the semiconductor integrated device of the present invention, first, the step-up voltage is lowered by a predetermined value for a predetermined period. Therefore, the period in which the step-up voltage is applied to the transistors, etc., can be reduced, an increase in the stand-by current resulting from the influence of the inter-band tunnel current can be restricted, and power consumption can be saved.

Second, according to the preferred embodiment of the semiconductor integrated circuit of the present invention, the value of the step-up voltage is decided on the basis of the threshold voltage for operating a plurality of MOS transistors, and the step-up voltage is lowered for a predetermined period. Therefore, read/write operations of the data from and to the memory cells can be carried out stably without being affected by the threshold voltage, and an increase in power consumption can be restricted by restricting an increase in the stand-by current.

Third, according to the preferred embodiment of the semiconductor integrated circuit of the present invention, the step-up voltage is lowered during the period in which the memory cell block is not selected. Therefore, read/write operations of the data from and to the memory cells can be carried out without error, and the increase in power consumption due to the increase in the inter-band tunnel current under the memory cell non-selected state can be reduced.

Fourth, according to the preferred embodiment of the semiconductor integrated circuit of the present invention, the step-up voltage is lowered in only the circuit portion that outputs the low voltage level under the state in which the memory cell block is not selected. Therefore, power consumption due to an increase in the inter-band tunnel current under the non-selected state can be reduced without generating the erroneous operation of the circuit.

Fifth, according to the preferred embodiment of the semiconductor integrated circuit of the present invention, the step-up voltage is lowered independently for each operation block inside the memory cell block. Therefore, an efficiency of the circuit operation can be improved when a write operation and a read operation are selectively executed inside the memory cell block.

Sixth, according to the preferred embodiment of the semiconductor integrated circuit of the present invention, the period for lowering the step-up voltage is decided by the bit line transfer signal. Therefore, read/write operations of data from and to the selected operation block inside the memory cell block can be carried out without error, and power consumption due to the increase in the inter-band tunnel current in the non-selected operation blocks can be reduced.

Seventh, according to the preferred embodiment of the semiconductor integrated circuit of the present invention, when the core circuit portion includes a plurality of MOS transistors, the step-up voltage lowering unit is not disposed in the circuit portion for applying the back bias of the MOS transistors. Consequently, an increase in the chip area can be restricted.

Eighth, according to the semiconductor integrated device of the present invention, when the core circuit portion contains a plurality of MOS transistors, the step-up voltage lowering unit is not disposed in the circuit portion for applying the back bias of these MOS transistors and in this way, an increase in the chip area can be restricted.

We claim:

1. A semiconductor integrated circuit including a memory cell block containing a plurality of memory cells, and a core circuit portion for selecting one of said memory cells comprising:

a step-up voltage circuit supplying a step-up voltage; and a step-up voltage lowering portion for lowering said step-up voltage by a predetermined value;

wherein said core circuit portion selectively receives said step-up voltage or an output voltage of said step-up voltage lowering portion.

2. The semiconductor integrated circuit according to claim 1, wherein said semiconductor integrated circuit is a dynamic random access memory containing a plurality of MOS transistors, a value of said step-up voltage is determined on the basis of a threshold voltage of said MOS transistors.

3. The semiconductor integrated circuit according to claim 1, wherein said core circuit receives the output voltage of said step-up voltage lowering portion during a period in which said memory cell block is not selected.

4. The semiconductor integrated circuit according to claim 3, wherein said semiconductor integrated circuit is a dynamic random access memory containing a plurality of MOS transistors, a value of said step-up voltage is determined on the basis of a threshold voltage of said MOS transistors.

5. The semiconductor integrated circuit according to claim 1, wherein said step-up voltage lowering portion is coupled to only a circuit portion which outputs a low voltage level under the state in which said memory cell block is not selected.

6. The semiconductor integrated circuit according to claim 5, wherein said semiconductor integrated circuit is a dynamic random access memory containing a plurality of MOS transistors, a value of said step-up voltage is determined on the basis of a threshold voltage of said MOS transistors.

7. The semiconductor integrated circuit according to claim 1, wherein said memory cell block has a plurality of operation blocks, said step-up voltage lowering portion is coupled independently to each of a plurality of said operation blocks.

8. The semiconductor integrated circuit according to claim 7, wherein said semiconductor integrated circuit is a dynamic random access memory containing a plurality of MOS transistors, a value of said step-up voltage is determined on the basis of a threshold voltage of said MOS transistors.

9. The semiconductor integrated circuit according to claim 7, wherein a timing for providing said core circuit portion with the output voltage of said step-up voltage lowering portion and the timing for providing said core circuit portion with said step-up voltage are determined by a bit line transfer signal for selecting a specified operation block among said plurality of operation blocks.

10. The semiconductor integrated circuit according to claim 9, wherein said semiconductor integrated circuit is a dynamic random access memory containing a plurality of MOS transistors, a value of said step-up voltage is determined on the basis of a threshold voltage of said MOS transistors.

11. The semiconductor integrated circuit according to claim 1, wherein said memory cell block has a plurality of operation blocks, said step-up voltage lowering portion is coupled to only a part of said plurality of operation blocks.

12. The semiconductor integrated circuit according to claim 11, wherein said semiconductor integrated circuit is a dynamic random access memory containing a plurality of MOS transistors, a value of said step-up voltage is determined on the basis of a threshold of said MOS transistors.

13. The semiconductor integrated circuit according to claim 1, wherein said core circuit portion includes a plurality of MOS transistors, said step-up voltage lowering portion is not coupled to a circuit portion for applying a back bias to said MOS transistors.

14. The semiconductor integrated circuit according to claim 13, wherein said semiconductor integrated circuit is a dynamic random access memory containing a plurality of MOS transistors, a value of said step-up voltage is determined on the basis of a threshold voltage of said MOS transistors.

15. A semiconductor integrated circuit comprising:
a memory cell array including a plurality of memory cells;
a circuit portion for selecting one of said memory cells in said memory cell array, and receiving a step-up voltage in a first time period; and
a step-up voltage lowering portion for lowering said step-up voltage by a predetermined value;
wherein said circuit portion selectively receives one of said step-up voltage and an output voltage of said step-up voltage lowering portion.

16. A semiconductor integrated circuit including a memory cell blocks containing a plurality of memory cells, and a core circuit portion for selecting one of said memory cells in said memory cell block, and constituted so as to supply a step-up voltage to said core circuit portion at the time of an activated state, said semiconductor integrated circuit comprising;
a step-up voltage lowering portion for lowering said step-up voltage by a predetermined value for a predetermined period of time; wherein said core circuit portion selectively receives said step-up voltage or an output voltage of said step-up voltage lowering means to said core circuit portion.

17. A semiconductor integrated circuit comprising:
a memory cell array including a plurality of memory cells;
a circuit portion for selecting one of said memory cells in said memory cell array, and receiving a step-up voltage in a first period; and
a step-up voltage lowering portion for lowering said step-up voltage by a predetermined value;
wherein said circuit portion selectively receives one of said step-up voltage and an output voltage of said step-up voltage lowering portion in a second time period.

18. A memory, comprising:
a memory cell block;
a step-up voltage generation circuit generating a step-up voltage;
a voltage converter receiving the step-up voltage and generating a reduced voltage which is lower than the step-up voltage; and
a MOS transistor having a first electrode, a second electrode and a control electrode, wherein said first electrode selectively receives the step-up voltage or the reduced voltage, said second electrode is coupled to said memory cell block and said control electrode receives address information.

19. The memory according to the claim 18, wherein
said first electrode receives the step-up voltage when said memory cell block is in an active state,
and the first electrode receives the reduced voltage when said memory cell block is in a non-active state.

20. The memory according to the claim 19, wherein
said non-active state is in a standby state.

21. The memory according to the claim 18, further comprising:
a switch coupled between said step-up voltage generation circuit and said first electrode, wherein said switch operates in response to a block selection signal.

22. The memory according to the claim 18, wherein said memory cell block including:

a memory cell capacitor;

a bit line; and a memory access transistor connected between said memory cell capacitor and said bit line; wherein said second electrode of the MOS transistor is coupled to a control node of said memory access transistor.

23. The memory according to the claim 18, wherein the memory cell block including:

a bit line coupled to a memory cell;

a sense amplifier for amplifying a potential on the bit line; and a transfer transistor coupled between said bit line and said sense amplifier;

wherein said second electrodes of said MOS transistor is coupled to a control node of said transfer transistor.

24. The memory according to the claim 23, further comprising:

a bit line transfer signal generation circuit receiving the step-up voltage and generating a bit line transfer signal for controlling said transfer transistor; and a switch coupled between said step-up voltage generation circuit and said first electrode of said MOS transistor, wherein said switch operates in response to said bit line transfer signal.

25. The memory according to the claim 18, wherein the reduced voltage has a level for preventing a sub-band current through said MOS transistor.

26. A memory according to the claim 18, wherein said voltage converter including a diode-connected transistor.

27. The memory according to the claim 18, wherein said memory cell block including:

a bit line;

a bit line reset transistor for providing said bit line with a reset level; wherein said second electrode of said MOS transistor is coupled to a control node of said bit line reset transistor.

* * * * *